(12) United States Patent
Casagrande

(10) Patent No.: US 8,183,947 B2
(45) Date of Patent: May 22, 2012

(54) LOW POWER CONSUMING QUARTZ OSCILLATOR CIRCUIT WITH ACTIVE POLARISATION

(75) Inventor: Arnaud Casagrande, Hauterive (CH)

(73) Assignee: The Swatch Group Research and Development Ltd, Marin (CH)

( * ) Notice: Subject to any disclaimer, the term of this patent is extended or adjusted under 35 U.S.C. 154(b) by 27 days.

(21) Appl. No.: 12/809,954

(22) PCT Filed: Dec. 4, 2008

(86) PCT No.: PCT/EP2008/066799
§ 371 (c)(1),
(2), (4) Date: Sep. 10, 2010

(87) PCT Pub. No.: WO2009/077343

PCT Pub. Date: Jun. 25, 2009

(65) Prior Publication Data
US 2010/0321123 A1 Dec. 23, 2010

(30) Foreign Application Priority Data
Dec. 19, 2007 (EP) .................... 07150135

(51) Int. Cl.
*H03B 5/36* (2006.01)

(52) U.S. Cl. .................... 331/158; 331/17; 331/116 FE; 331/177 R
(58) Field of Classification Search .................... 331/17, 331/116 FE, 158, 177 R
See application file for complete search history.

(56) References Cited

U.S. PATENT DOCUMENTS 5,546,055 A * 8/1996 Klughart ................. 331/116 FE
5,952,877 A 9/1999 Broome
(Continued)

FOREIGN PATENT DOCUMENTS
CH 623 450 6/1981
(Continued)

OTHER PUBLICATIONS

"Quartz oscillators for watches" by Eric A. Vittoz, published in the proceedings of the tenth International Chronometry Congress, Geneva, Sep. 1979, vol. 3, pp. 131 to 140.

(Continued)

*Primary Examiner* — James E Goodley
(74) *Attorney, Agent, or Firm* — Griffin & Szipl, P.C.

(57) ABSTRACT

The quartz oscillator circuit includes an inverter comprising two complementary PMOS and NMOS transistors (P1, N1) series-mounted with a current source (4) between two terminals of a supply voltage source to define an active branch. A source terminal of the PMOS transistor (P1) is connected to the current source, whereas a source terminal of the other NMOS transistor (N1) is connected to an earth terminal. Drain terminals of the transistors are connected at output to a first electrode ($X_{OUT}$) of the quartz (3), whereas the gate terminals of the transistors are connected at input to a second electrode ($X_{IN}$) of the quartz. A first phase shift capacitor ($C_1$) is connected to the first electrode of the quartz, whereas a second capacitor ($C_2$) is connected to the second electrode of the quartz. The oscillator circuit includes active polarisation means (2) arranged between the drain terminals and the gate terminals of the inverter transistors. These polarisation means can be a follower-mounted operational transconductance amplifier, whose impedance value is sufficiently high so as not to damage the transconductance of the active branch for generating an oscillation in the quartz.

6 Claims, 3 Drawing Sheets

U.S. PATENT DOCUMENTS 7,061,338 B2 * 6/2006 Arigliano .................. 331/109

FOREIGN PATENT DOCUMENTS

| CH | 689 088 | 9/1998 |
|---|---|---|
| FR | 2 461 395 | 1/1981 |

OTHER PUBLICATIONS

"High-performance crystal oscillator circuits : Theory and application" by Eric A. Vittoz, published in the IEEE journal of solid-state circuits, IEEE service center, Piscataway, NJ, US, vol. 23, No. 3 on Jun. 1, 1988.

Aeibischer, D. et al. "A 2.1-MHZ Crystal Oscillator Time Base with a Current Consumption Under 500 NA," IEEE Journal of Solid-Circuits, IEEE Service Center, Piscataway, NJ, US, vol. 32, No. 7, Jul. 1, 1997, pp. 999-1005.

Thommen, W., "An improved low power crystal oscillator," Solid-State Circuits Conference, 1999, Esscirc '99, Proceedings of the 25th European Duisburg, Germany, Sep. 21-23, 1999, Piscataway, NJ, IEEE, Sep. 21, 1999, pp. 146-149.

Vince R Von Kaenel et al. "Crystal Oscillators" Analog Circuit Design, Jan. 1, 1996, pp. 369-382, XP009101197.

International Search Report issued in corresponding application No. PCT/EP2008/066799, completed Mar. 10, 2009 and mailed Mar. 20, 2009.

* cited by examiner

LOW POWER CONSUMING QUARTZ OSCILLATOR CIRCUIT WITH ACTIVE POLARISATION

This is a National Phase Application in the United States of International Patent Application PCT/EP 2008/066799 filed Dec. 4, 2008, which claims priority on European Patent Application No. 07150135.7 of Dec. 19, 2007. The entire disclosures of the above patent applications are hereby incorporated by reference.

FIELD OF THE INVENTION

The invention concerns a low power consuming quartz oscillator circuit with active polarization, particularly for horological use.

The oscillator circuit can include an inverter, formed of two complementary MOS transistors, mounted in series with a current source between two terminals of a supply voltage source, to define an active branch. One source terminal of one of the MOS transistors is connected to the current source, whereas one source terminal of the other transistor is connected to one of the terminals of the supply voltage source. The drain terminals of the NMOS and PMOS transistors are connected at output to a first electrode of the quartz, whereas the gate terminals of said transistors are connected at input to a second electrode of the quartz. A first phase shift capacitor is usually connected to the first electrode of the quartz, whereas a second adjustable capacitor is connected to the second electrode of the quartz.

BACKGROUND OF THE INVENTION

This type of oscillator circuit is disclosed in the state of the art by CH Patent No. 623 450, which also provides a polarisation resistor arranged between the gates and drains of the inverter transistors. This assembly produces a voltage oscillation in the quartz to generate an oscillation signal at a frequency determined by the first output electrode of the quartz.

To make a low power consuming oscillator circuit by reducing the current in the active branch of the oscillator, the polarisation resistance must have a high value. This high value polarisation resistance must be chosen so that it does not destroy the necessary negative resistance, which is generated by the inverter and the current passing therethrough to maintain the quartz oscillation. When this type of low power consuming oscillator circuit is integrated in a silicon substrate, using a high value resistor may be problematic, since it occupies a good deal of space in the integrated circuit. This is thus a drawback of this type of low power consuming oscillator circuit.

The amplitude of the quartz oscillation can also be maintained by an adaptable current source controlled by a regulating unit. An embodiment of this type of regulating unit is disclosed, for example, in the article entitled, "Quartz oscillators for watches" by Eric A. Vittoz, published in the proceedings of the tenth International Chronometry Congress, Geneva, September 1979, Vol. 3, pages 131 to 140.

In the article entitled "High-performance crystal oscillator circuits: Theory and application" by Eric A. Vittoz, published in the IEEE journal of solid-state circuits, IEEE service center, Piscataway, NJ, US, vol. 23, no. 3 on 1 Jun. 1988, it is provided to arrange between the drain and gate terminals of a MOS transistor M1 in an active branch of the oscillator circuit, a pseudo-resistor, which is active polarisation means. As shown in FIG. 11 of this article, this pseudo-resistor is made using a MOS transistor M17, for which the drain and source terminals are respectively connected to the drain and gate terminals of the MOS transistor M1. The gate terminal of the pseudo-resistor transistor is polarised via two MOS transistors M19 and M15, which are series-mounted in diode with a current source M10 between two supply terminals of the supply voltage source.

A drawback of this arrangement shown in FIG. 11 of this article, is that the polarising current supplied by the current source M10 is lost through the two transistors mounted in diode. This polarising current is used only to define determined potentials of said transistors mounted in diode, and does not contribute for the operation in the active branch of the oscillator.

In the CH Patent No. 689 088, it is described an oscillator circuit in which the active polarisation means are an operational transconductance amplifier mounted as a voltage follower between the drain and gate terminals of a MOS transistor in an active branch of the oscillator circuit. Two capacitors C1, C2 are each connected respectively to a quartz terminal K and to the earth, whereas a compensation capacitor $C_K$ is connected between the output of the amplifier and one terminal of the quartz. Said capacitors C1, C2 have a great capacitive value in order to stabilise the amplifier, which constitutes a drawback, because they don't allow make a small size oscillator circuit.

SUMMARY OF THE INVENTION

It is thus an object of the invention to overcome the drawbacks of the state of the art, by providing a low power consuming quartz oscillator circuit, which has active polarisation and which is easy to integrate, yet guarantees high polarisation impedance without damaging the quartz oscillation.

The invention therefore concerns the aforementioned quartz oscillator circuit, which includes an inverter comprising two complementary PMOS and NMOS transistors series-mounted with a current source between two terminals of a supply voltage source to define an active branch. A source terminal of the PMOS transistor is connected to the current source, whereas a source terminal of the other NMOS transistor is connected to an earth terminal. Drain terminals of the transistors are connected at output to a first electrode of the quartz, whereas the gate terminals of said transistors are connected at input to a second electrode of the quartz. A first phase shift capacitor is connected to the first electrode of the quartz, whereas a second capacitor is connected to the second electrode of the quartz. The oscillator circuit includes active polarisation means arranged between the drain terminals and the gate terminals of the inverter transistors. These polarisation means can be a follower-mounted operational transconductance amplifier, whose impedance value is sufficiently high so as not to damage the transconductance of the active branch for generating an oscillation in the quartz, wherein the active polarisation means includes between the drain terminals and gate terminals of the complementary MOS transistors, an operational transconductance amplifier mounted as a voltage follower and stabilised by a stray capacitor of the horological quartz, or a pseudo-resistor made using a MOS transistor, whose a gate terminal is connected to the gate terminals of the complementary MOS transistors, a drain terminal is connected to the drain terminals of the complementary MOS transistors, and the gate terminal is polarised via a second polarising current source, whose the current is provided for passing through the second complementary MOS transistor in addition to the current of the first current source.

Particular embodiments of the quartz oscillator circuit are defined in the dependent claims 2 to 6.

One advantage of the oscillator circuit according to the invention is that it includes active polarisation means with high impedance, arranged in part between the gate and drain terminals of the inverter transistors. These polarisation means can be made with simple electronic components that are easy to integrate. When the oscillator circuit is switched on, the active polarisation means initially polarise the gates of the MOS transistors of the inverter, to generate an oscillation in the quartz. Once the oscillation has stabilised, the effective transconductance of the active branch, which generates negative resistance in parallel to the quartz, is vital for maintaining the quartz oscillation without said oscillation being damaged by the high impedance of the polarisation means. Thus, the total transconductance of the active branch compensates entirely for the polarisation impedance in order to maintain the quartz oscillation.

One advantage of using an operational transconductance amplifier, configured as a voltage follower, for the polarisation means, is that it actively polarises the oscillator part of the oscillator circuit with very high impedance.

This follower supplies an output current when the oscillation is generated in the quartz. Moreover, since the oscillator comprises a quartz in a Pierce configuration, the quartz stray capacitor, mounted in a Miller configuration, stabilises the amplifier completely without having to include other capacitors in the oscillator circuit for this purpose.

One advantage of the oscillator circuit is that it can include a pseudo-resistor as active polarisation means. This pseudo-resistor can be made using an NMOS transistor, for which the source terminal is connected to the gate terminals of the inverter transistors, and the drain terminal is connected to the drain terminals of the inverter transistors. This pseudo-resistor is polarised on its gate terminal by another small value current source, which is connected also to the drain and gate terminals of another NMOS transistor, for which the source terminal is connected to the drain terminals of the inverter transistors. In oscillation phase, the low current from current source is added to the current supplied by the polarising current source of the active branch in the NMOS transistor of the inverter.

The polarising current of the active branch, and the low supply current of the polarisation means can advantageously be adapted in a regulating unit, on the basis of the amplitude level detected in the first quartz electrode.

BRIEF DESCRIPTION OF THE DRAWINGS

The objects, advantages and features of the quartz oscillator circuit will appear more clearly in the following description with reference to non-limiting examples, illustrated by the drawings, in which.

DETAILED DESCRIPTION OF THE PREFERRED EMBODIMENTS

In the following description, any elements of the quartz oscillator circuit that are well known to those skilled in this technical field will be described only in a simplified manner. Reference is mainly made to a quartz oscillator circuit capable of supplying clock signals, in particular for horological use.

Figure 1:
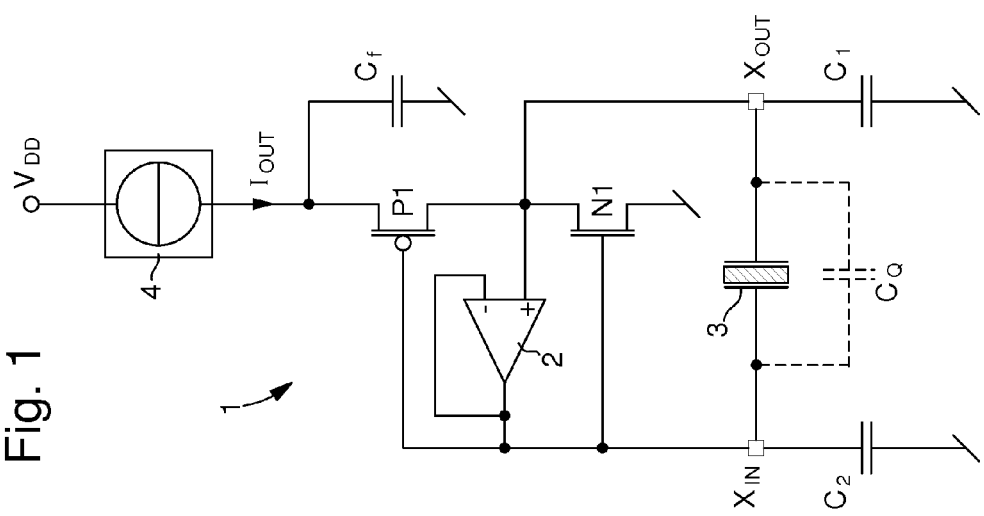
FIG. 1 shows a first simplified embodiment of the oscillator part of the quartz oscillator circuit according to the invention.

FIG. 1 shows a first embodiment of the oscillator part 1 of the quartz oscillator circuit. This oscillator part 1 of the oscillator circuit includes an inverter comprising two complementary MOS transistors N1 and P1 series-mounted with a current source 4 between a positive terminal $V_{DD}$ and an earth terminal of a continuous supply voltage source (not shown). This series arrangement of the inverter with the current source defines the active branch of the oscillator.

A source terminal of the first PMOS transistor P1 is connected to the current source 4, which is connected to the positive terminal $V_{DD}$ of the voltage source. A source terminal of the second NMOS transistor N1 is connected to the earth terminal of the voltage supply source. The drain terminals of the two transistors P1 and N1 are both connected to a first electrode of quartz 3, to define an output terminal $X_{OUT}$ of the oscillator circuit. The gate terminals of the two transistors P1 and N1 are, however, both connected at input to a second electrode of quartz 3, to define an input terminal) $X_{IN}$. This input terminal $X_{IN}$ is used for detecting oscillation amplitude via a regulating unit, which is explained below with reference to FIG. 4.

A filtering capacitor $C_f$ of suitable value is connected between the source terminal of the first PMOS transistor P1 of the inverter and the earth terminal. This filtering capacitor can filter the oscillation voltage in current source 4, which is at high impedance. Thanks to this capacitor, which sets the source terminal of first transistor P1, this makes the first transistor active in the same way as the second NMOS transistor N1, whose source terminal is directly connected to the earth terminal. These two transistors N1 and P1 act in combination in the active branch to maintain the oscillation in quartz 3 with a current that is well defined by current source 4.

The oscillator is a Pierce type with a first phase shift capacitor $C_i$, which is connected between the first electrode $X_{OUT}$ of quartz 3, and earth, and a second adjustable capacitor $C_2$, which is connected between the second quartz electrode $X_{IN}$ and earth. This quartz or quartz resonator 3 comprises a stray capacitor $C_Q$, shown in dotted lines in FIG. 1, which is in parallel with series-mounted elements (not shown), namely an inductance, a resistor and another capacitor. This stray capacitor can have a value close to 1 to 1.5 pF for a timepiece quartz that can oscillate at a frequency of the order of 32.768 kHz.

Since the quartz oscillator is meant to operate with low power consumption, the polarising current $I_{OUT}$ of the active branch has a low value, for example, of the order of 30 nA or less. This leads to a transconductance gm in the active branch that is critical for extremely low currents. Polarisation means, with the highest possible impedance, must therefore be provided between the gate and drain terminals of the complementary MOS transistors P1 and N1 of the inverter. The impedance must be high enough, for example of the order of 100 MΩ or higher, not to damage the effective transconductance of the active branch to ensure that the quartz oscillation is maintained.

The active polarisation means in this first embodiment is an operational transconductance amplifier 2 (OTA) mounted as a voltage follower. The positive input terminal of this amplifier is connected to the drain terminals of the first PMOS transistor P1 and the second NMOS transistor N1, and to the first electrode $X_{OUT}$ of quartz 3. The negative input terminal is connected to the output terminal of the amplifier and to the gate terminals of transistors P1 and N1, and to the second electrode $X_{IN}$ of quartz 3.

As indicated above, the impedance of the active polarisation means must be high enough for power consumption to be mainly dominated by the quartz. This ensures that the quartz oscillation is maintained. Once the oscillation has stabilised, the continuous input voltage and the continuous output voltage of the OTA amplifier, mounted as a voltage follower, are equal. Consequently, the oscillation signal across output electrode $X_{OUT}$ is phase shifted by 180° from the oscillation signal across the input electrode $X_{IN}$.

If this type of operational transconductance amplifier 2 is used, the cut-off frequency must be lower than the oscillation frequency of quartz 3. However, in the case of oscillation at a frequency of the order of 32 kHz by a timepiece quartz, the voltage follower configuration of an OTA amplifier 2 between the drain and gate terminals of transistors P1 and N1 can lead to instability. This type of OTA amplifier 2, powered by a low current, for example of the order of 3 nA or lower, can thus generate oscillation at an undesirable stray frequency.

However, since quartz 3 includes a stray capacitor $C_Q$, placing this capacitor in parallel, in a Miller configuration, with OTA amplifier 2 in a follower configuration, stabilises this arrangement completely. In the Miller configuration, the capacitive value of the stray capacitor is multiplied by the very high gain of the effective loop at the active branch output. This naturally means that the cut-off frequency of OTA amplifier 2 in a follower configuration with the stray capacitor in a parallel configuration is greatly decreased, with a sufficient phase margin, and the OTA follower is thus completely stabilised. Because of this, there is no need to use other capacitors for stabilising the amplifier, which is a considerable advantage of the quartz/active polarisation means combination of this OTA follower.

Figure 2:
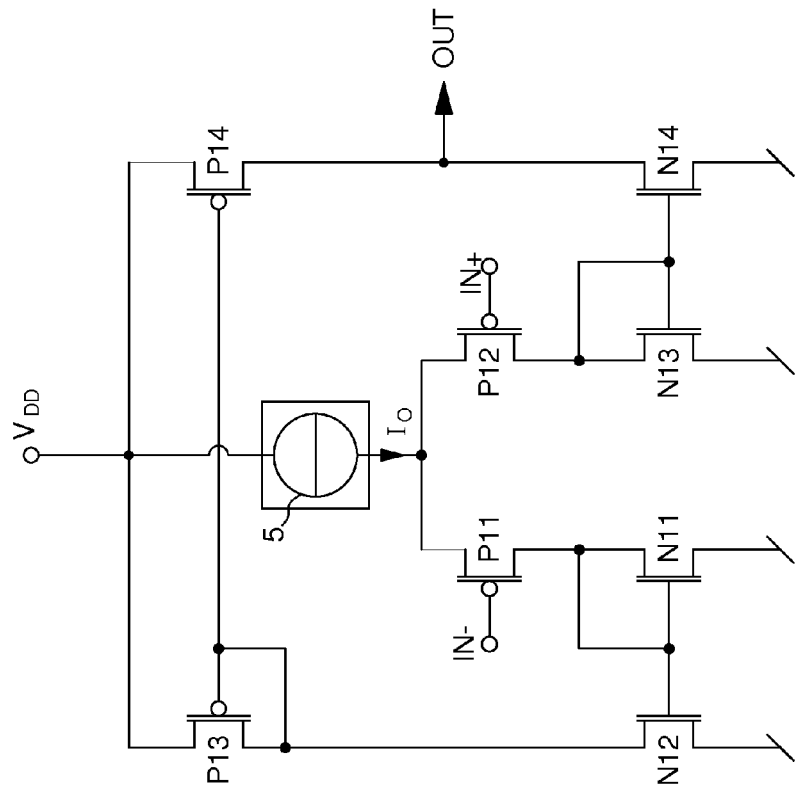
FIG. 2 shows an embodiment of the amplifier used as polarisation means in FIG. 1, for a quartz oscillator circuit according to the invention.

An embodiment of this type of operational transconductance amplifier OTA used as active polarisation means for the oscillator circuit is shown in FIG. 2. This amplifier includes, firstly, a differential PMOS transistor pair P11 and P12, with the source terminal of each transistor connected to a current source 5, which is connected to a positive terminal $V_{DD}$ of the supply voltage terminal. The gate terminal of the first PMOS input transistor P11 forms the negative input terminal IN− of the amplifier, whereas the gate terminal of the second PMOS input transistor P12 forms the positive input terminal IN+ of the amplifier.

The drain terminal of the first input transistor P11 is connected to the drain and gate terminals of a first NMOS transistor N11 of a first NMOS current mirror. The gate terminal of this first transistor N11 is connected to a gate terminal of an identical second NMOS transistor N12 of the first NMOS current mirror. The source terminals of the first and second transistors N11 and N12 are connected to the earth terminal. The first NMOS transistor N11 is arranged to mirror the current passing therethrough in the second NMOS transistor N12.

The drain terminal of the second NMOS transistor N12 of the first NMOS current mirror is connected to the drain and gate terminals of a first PMOS transistor P13 of a PMOS current mirror. The gate terminal of this first PMOS transistor P13 is connected to a gate terminal of an identical second PMOS transistor P14 of the PMOS current mirror. The source terminals of the first and second transistors P13, P14 of the PMOS current mirror are connected to the positive terminal $V_{DD}$ of the supply voltage source. The first PMOS transistor P13 is arranged to mirror the current passing therethrough, originating from the second NMOS transistor N12, in the second PMOS transistor P14, whose drain terminal is connected to the amplifier output terminal OUT.

The drain terminal of the second input transistor P12 is connected to the drain and gate terminals of a first NMOS transistor N13 of a second NMOS current mirror. The gate terminal of this first transistor N13 is connected to a gate terminal of an identical second NMOS transistor N14 of the second NMOS current mirror. The source terminals of the first and second transistors N13, N14 are connected to the earth terminal. The first NMOS transistor N13 is arranged to mirror the current passing therethrough in the second NMOS transistor N14. The drain terminal of transistor N14 is directly connected to the drain terminal of transistor P14, and to the amplifier output terminal OUT.

When the negative input terminal IN− of the first input transistor P11 is polarised by a lower voltage than the voltage polarising the positive input terminal IN+ of the second input transistor P12, the current from current source 5 passes mainly between the source and drain terminals of the first transistor P11. Consequently, this current is mirrored by the first NMOS mirror and the PMOS mirror in order to draw the amplifier current output OUT upwards. Conversely, in the opposite case, where the negative input terminal IN− is polarised by a higher voltage than the voltage polarising the positive input terminal IN+, the current from current source 5 passes mainly between the source and drain terminals of second transistor P12. Thus, the current mirrored by the second NMOS current mirror draws the amplifier current output OUT downwards.

The current consumption of the operational transconductance amplifier is relatively low. The mean consumption is of the order of twice the value of current $I_0$ from current source 5, which may be of the order of 3 nA or less. The current from current source 5 can also be adapted in accordance with the oscillation amplitude detected in the quartz by means of a regulating unit that is explained below with reference to FIG. 4. The current source is made in said regulating unit.

Figure 3:
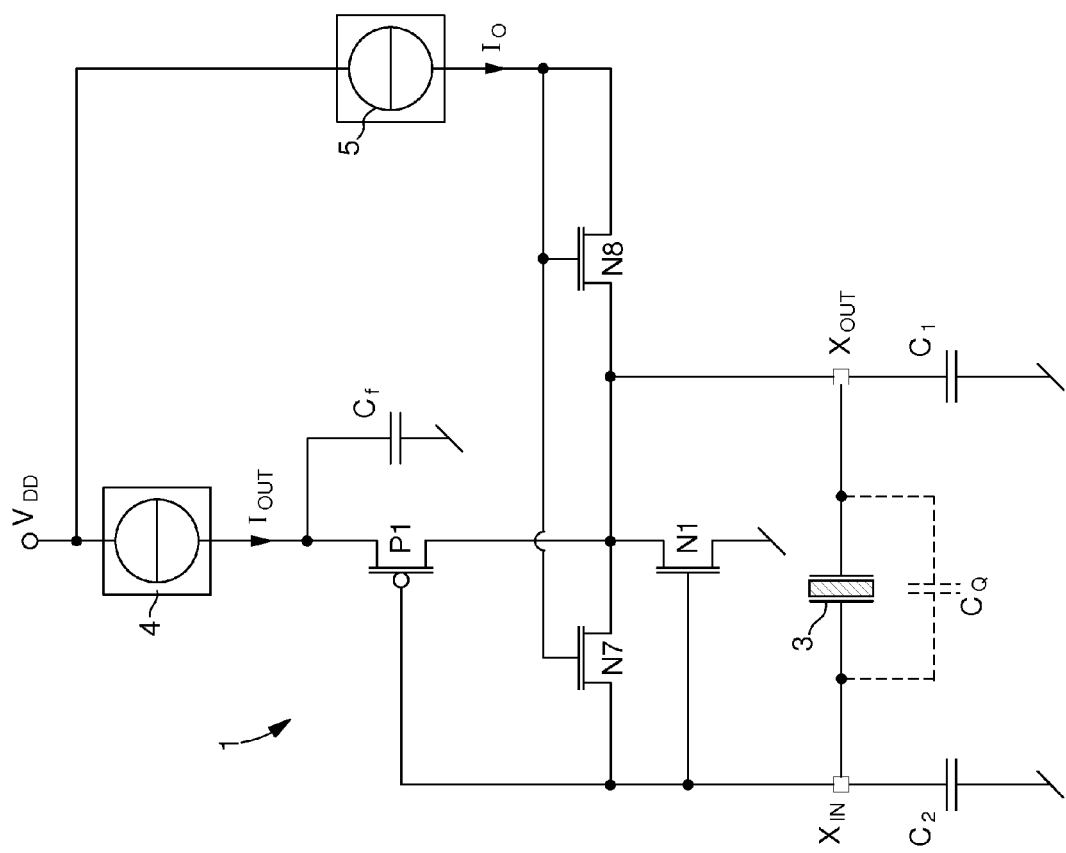
FIG. 3 shows a second simplified embodiment of the oscillator part of the quartz oscillator circuit according to the invention.

FIG. 3 shows a second embodiment of the oscillator part 1 of the quartz oscillator circuit. It should be noted that those elements that are the same as in the oscillator circuit described above with reference to FIG. 1 bear identical reference numerals. Consequently, for the sake of simplification, the description of these elements will not be repeated in FIG. 3.

The essential difference of this second embodiment relates to the active polarisation means arranged partly between the drain and gate terminals of complementary MOS transistors P1 and N1 of the inverter. These active polarisation means essentially include a pseudo-resistor made using an NMOS transistor N7. The source terminal of transistor N7 is connected to the gate terminals of transistors P1 and N1 of the inverter, and the drain terminal of transistor N7 is connected to the drain terminals of transistors P1, N1 of the inverter.

The gate terminal of pseudo-resistor transistor N7 is connected to the drain and gate terminals of an NMOS polarising transistor N8 for receiving a current $I_0$ from a current source 5 made in the regulating unit. This current source 5 is connected to the positive terminal $V_{DD}$ of a supply voltage source that is not shown. The source terminal of NMOS transistor N8 is connected to the drain terminals of transistors P1, N1 of the inverter. In oscillation phase, the low current $I_0$ from current source 5 is added to the current $I_{OUT}$ supplied by the polarising current source 4 of the active branch in the NMOS transistor N1 of the inverter.

This second embodiment, with pseudo-resistor N7, cannot provide such high oscillation amplitude for quartz 3 as the first embodiment. This is due to the impedance of pseudo-resistor N7, which drops and damages the effective transconductance of the active branch when the voltage level across the second electrode $X_{IN}$ in oscillation phase drops by a too great value relative to the voltage level across the first electrode $X_{OUT}$.

Figure 4:
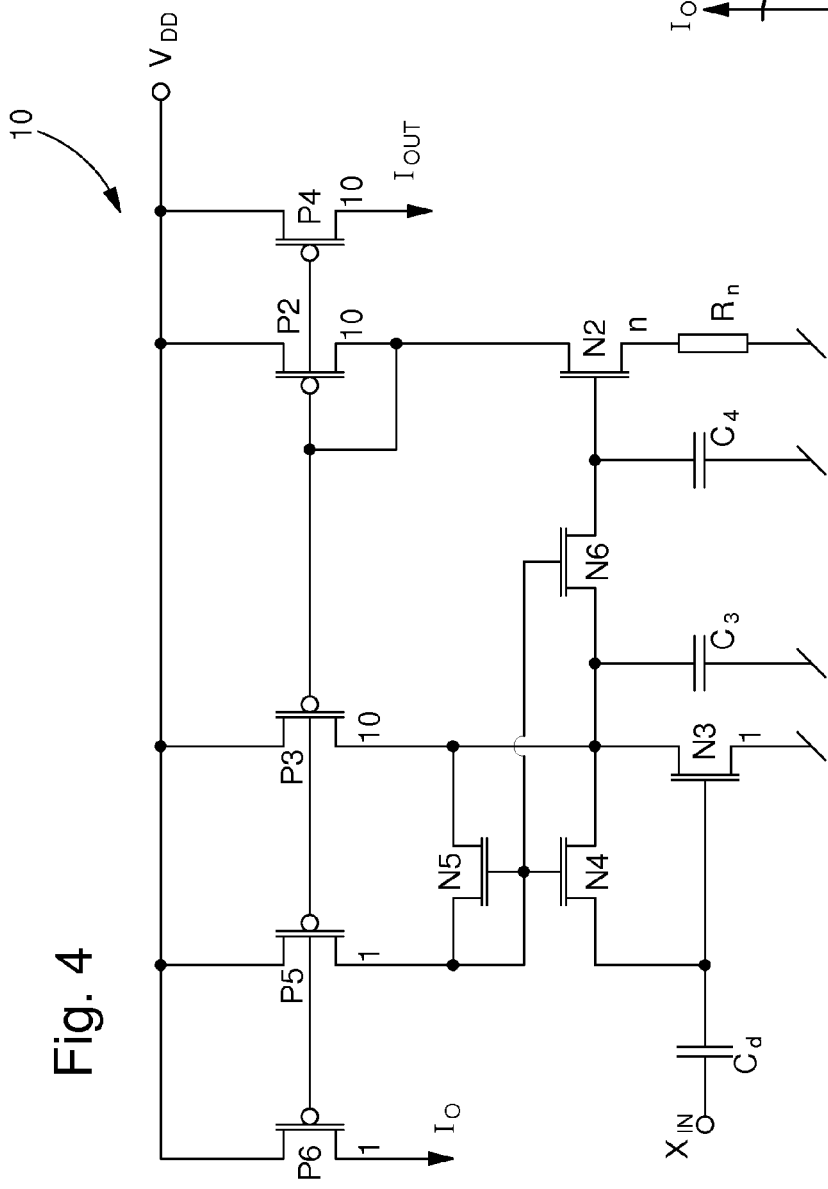
FIG. 4 shows a unit for regulating the polarising current of the oscillator part of the quartz oscillator circuit according to the invention.

FIG. 4 shows a unit 10 for regulating the polarising current of the oscillator part of the quartz oscillator circuit. This regulating unit is connected via a detection capacitor $C_d$ to the second input electrode $X_{IN}$ of the quartz for detecting the oscillation amplitude. This detection capacitor has a low capacitive value, for example of the order of 0.5 pF.

Regulating unit 10 mainly includes a PMOS current mirror connected to an NMOS current mirror to make at least one proportional to absolute temperature current source (PTAT). This current source must be able to be adapted in accordance with the oscillation amplitude level over the quartz detected via capacitor $C_d$.

In order to do this, the NMOS mirror comprises a first unitary NMOS transistor N3 indicated with a sign 1. The source terminal of transistor N3 is connected to the earth terminal. The gate terminal of transistor N3 is connected to detection capacitor $C_d$. The drain and gate terminals of this first unitary transistor N3 are connected to each other via a first pseudo-resistor, which is formed by an NMOS transistor N4 between the drain and source terminals thereof. The pseudo-resistor impedance has a high value, yet ensures a voltage gap close to 0 V between the drain terminal and the gate terminal of the first transistor N3.

The drain terminal of first unitary NMOS transistor N3 is connected to the gate terminal of a second NMOS transistor N2 of the NMOS current mirror via a second pseudo-resistor, which is formed by an NMOS transistor N6 between the drain and source terminals thereof. The impedance of the second pseudo-resistor also has a high value. The dimension of the second NMOS transistor N2 is n times greater than the dimension of first unitary NMOS transistor N3, i.e. the gate width of the second transistor N2 can be n times greater than the gate width of the first transistor N3. The integer number n can be for example equal to 4. The source terminal of the second NMOS transistor N2 is connected to the earth terminal via a resistor $R_n$, for example of the order of 1 MΩ. This defines the value of the current passing through the two NMOS transistors N3 and N2 by combining with the PMOS current mirror to make the PTAT current source.

A first stabilising capacitor $C_3$ may be provided, connected between the drain terminal of the first NMOS transistor N3 and the earth terminal, and a second stabilising capacitor $C_4$, connected between the gate terminal of the second NMOS transistor N2 and the earth terminal. Each of these capacitors $C_3$, $C_4$ may have a capacitive value of the order of 5 pF for example.

The second NMOS transistor N2 controls the PMOS current mirror. The drain terminal of the second transistor N2 is directly connected to the drain and gate terminals of a first PMOS transistor P2, whose source terminal is connected to the positive terminal $V_{DD}$ of a supply voltage source. The gate terminal of a second PMOS transistor P3 of the PMOS current mirror, of equivalent size to the first transistor P2, is connected to the gate terminal of the first PMOS transistor P2.

The source terminal of this second transistor P3 is connected to the positive terminal $V_{DD}$, whereas its drain terminal is directly connected to the drain terminal of the first NMOS transistor N3 to close the PTAT defined current generation loop.

A third PMOS transistor P5 of the PMOS current mirror polarises the pseudo-resistors formed by NMOS transistors N4 and N6. In order to do this, the drain terminal of PMOS transistor P5 is connected to the gate terminals of transistors N4 and N6. The source terminal of this third PMOS transistor P5 is connected to the positive terminal $V_{DD}$ of the supply voltage source, whereas its gate terminal is connected to the gate terminal of transistors P2 and P3.

This third PMOS transistor P5 is smaller than the first and second PMOS transistors P2 and P3. Transistor P5 bearing the sign 1 can be ten times smaller than transistors P2 and P3. Consequently, the current mirrored in the third PMOS transistor P5 is 10 times less than the current passing through the first and second transistors P2 and P3. If the current in each transistor P2 and P3 is of the order of 30 nA or less, the current in third transistor P5 can thus be of the order of 3 nA or less.

The drain terminal of the third PMOS transistor P5 is also connected to the drain and gate terminals of a polarising NMOS transistor N5, whose source terminal is connected to the drain terminals of transistors P3 and N3 in an active branch. The current mirrored in this third PMOS transistor P5 will mainly pass between the drain and source terminals of polarising transistor N5 to be injected into the active branch formed by transistors P3 and N3. Thus, the current passing through NMOS transistor N3 includes the current from PMOS transistor P3 and PMOS transistor P5.

The arrangement of the pseudo-resistors formed by transistors N4 and N6, and of polarising NMOS transistor N5 enables the transistors to be well matched, with equal gate-source voltages. The gate potential of each of the transistors is equal and therefore well defined.

A fourth PMOS transistor P4 of the PMOS current mirror provides, via its drain terminal, the polarising current $I_{OUT}$ of the active branch of the oscillator part of the oscillator circuit. The gate terminal of transistor P4 is connected to the gate terminal of transistors P2 and P3, whereas its source terminal is connected to the positive terminal $V_{DD}$ of the supply voltage source. This fourth transistor P4 has a size, defined by sign 10, equivalent to the first and second PMOS transistors P2 and P3.

A fifth PMOS transistor P6 of the PMOS current mirror provides, via its drain terminal, the polarising current $I_0$ for the polarising means, which may be an OTA follower or include a pseudo-resistor. The gate terminal of transistor P6 is connected to the gate terminal of transistors P2, P3 and P4, whereas its source terminal is connected to the positive terminal $V_{DD}$ of the supply voltage source. The fifth transistor P6 may have a size equivalent to the third PMOS transistor P5, for example, 10 times smaller than PMOS transistors P2, P3 and P4, to supply a polarising current $I_0$. The value of this polarising current $I_0$ may be 10 times less than the polarising current of the active branch of the oscillator part.

Of course, the size of PMOS transistor P6 can be chosen to be 10 times less than the size of transistors P2, P3, P4 to further decrease polarising current $I_0$ relative to the inverter active branch current $I_0$.

Figure 5:
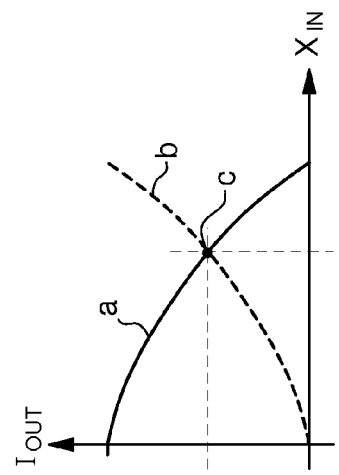
FIG. 5 shows a graph of the polarising current of the oscillator part as a function of the oscillation amplitude detected in the quartz oscillator circuit according to the invention.

As can be seen summarily in the graph of FIG. 5, the value of polarising current $I_{OUT}$ of the oscillator part active branch must decrease the more that the oscillation amplitude detected at the quartz input across terminal $X_{IN}$ increases.

Curve a in FIG. 5 represents the transfer function of the measured oscillation amplitude $X_{IN}$ relative to the output current $I_{OUT}$ of the regulating unit. Curve b represents the transfer function of the oscillator part current relative to the oscillation amplitude across electrode $X_{IN}$. Once oscillation has stabilised, the intersection of curves a and b represents an optimum value at point c, where the value of polarising current $I_{OUT}$ is adapted relative to the stabilised oscillation amplitude at $X_{IN}$.

The quartz oscillator circuit described above can be advantageously made in integrated form, with the exception of quartz 3, in a normally P doped silicon substrate in 0.18 μm CMOS technology. This provides a low power consuming oscillation circuit with active polarisation.

From the description that has just been given, those skilled in the art can devise several variants of the quartz oscillator circuit without departing from the scope of the invention defined by the claims. The oscillator part components can be mounted inversely between the positive terminal and the earth terminal of a supply voltage source. The polarising current source can thus be connected between the source terminal of the NMOS transistor of the inverter and the earth terminal, whereas the source terminal of the PMOS transistor is connected to the positive terminal. In such case, the regulating unit must be configured inversely to generate the polarising currents for the oscillator part.

The invention claimed is:

1. A horological quartz oscillator circuit including an inverter comprising two complementary MOS transistors, series-mounted with a first current source, between two terminals of a supply voltage source to define an active branch, a source terminal of the first MOS transistor being connected to the first current source, whereas a source terminal of the second MOS transistor is connected to one of the terminals of the supply voltage source, drain terminals of the two transistors of the inverter being together connected at output to a first electrode of the quartz, whereas gate terminals of said inverter transistors are together connected at input to a second electrode of the quartz, a first phase shift capacitor being connected to the first electrode of the quartz, whereas a second capacitor is connected to the second electrode of the quartz, the oscillator circuit including active polarisation means, arranged between the drain terminals and the gate terminals of the inverter transistors, the impedance value of said polarisation means being sufficiently high so as not to damage the transconductance of the active branch for generating an oscillation in the quartz, wherein the active polarisation means includes between the drain terminals and gate terminals of the complementary MOS transistors, an operational transconductance amplifier mounted as a voltage follower and stabilised by a stray capacitor of the horological quartz, or a pseudo-resistor made using a MOS transistor, whose source terminal is connected to the gate terminals of the complementary MOS transistors, a drain terminal is connected to the drain terminals of the complementary MOS transistors, and the gate terminal is polarised via a second polarising current source, whose the current is provided for passing through the second complementary MOS transistor in addition to the current of the first current source.

2. The horological quartz oscillator circuit according to claim 1, wherein the active polarisation means is the operational transconductance amplifier, whose a positive input terminal is directly connected to the drain terminals of the complementary MOS transistors of the inverter and to the first electrode of the quartz, and whose a negative input terminal is connected to an output terminal of the amplifier, to the gate terminals of the MOS transistors of the inverter and directly to the second electrode of the quartz, and wherein the stray capacitor of the horological quartz is placed in parallel in a Miller configuration with the follower-mounted amplifier to stabilise said amplifier, the capacitive value of said stray capacitor being multiplied by the gain of the effective loop via the amplifier.

3. The horological quartz oscillator circuit according to claim 1, wherein the active polarisation means include the pseudo-resistor, further comprising a MOS polarising transistor of the same type as the pseudo-resistor MOS transistor, a source terminal of the polarising transistor being connected to the drain terminals of the complementary MOS transistors of the inverter, and the drain and gate terminals of the polarising transistor being connected to a gate terminal of the pseudo-resistor MOS transistor and to the second polarising current source in order to polarise the pseudo-resistor MOS transistor and the polarising transistor, in which passes the polarising current, said polarising current being supplied via the polarising transistor to the second complementary MOS transistor.

4. The horological quartz oscillator circuit according to claim 1, wherein it includes a regulating unit, which is connected via a detection capacitor to the second electrode of the quartz to detect the oscillation amplitude level, and wherein the first current source of the active branch and the second polarising current source of the active polarisation means are made in the regulating unit, the current value of each current source being adapted in accordance with the detected oscillation amplitude level.

5. The horological quartz oscillator circuit according to claim 4, wherein a source terminal of the first PMOS transistor is connected to the first current source of the active branch, which is connected to the positive terminal of a voltage source, and wherein a source terminal of the second NMOS transistor is connected to the earth terminal of the voltage source, wherein the regulating unit includes at least one PMOS current mirror connected on the side of the positive terminal of the voltage source, combined with an NMOS current mirror connected on the side of the earth terminal of the voltage source, and a resistor, for defining the current value in a generation loop for at least one PTAT current source, wherein the NMOS current mirror includes a first unitary NMOS transistor, whose a gate terminal is connected to the detection capacitor and to a drain terminal of the first transistor via a first pseudo-resistor, the drain terminal of the first transistor being connected via a second pseudo-resistor to a gate terminal of a second NMOS transistor whose dimensions are n times greater than the first NMOS transistor, the source terminal of the second transistor being connected to the resistor, wherein the PMOS current mirror includes a first PMOS transistor, whose drain and gate terminals are connected to a drain terminal of the second NMOS transistor, a second PMOS transistor of equivalent size to the first PMOS transistor, with a gate terminal connected to the gate terminal of the first PMOS transistor and a drain terminal directly connected to the drain terminal of the first NMOS transistor to close the defined current generation loop, and wherein the PMOS current mirror includes a PMOS transistor as first current source for the active branch of the oscillator part, said PMOS transistor being of equivalent size to the first and second PMOS transistors, and another PMOS transistor as second polarising current source for the active polarisation means, the size of this other PMOS transistor being m times less than the other PMOS transistors, in particular 10 times less.

6. The horological quartz oscillator circuit according to claim 5, wherein the PMOS current mirror includes a third PMOS transistor of smaller size than the first and second PMOS transistors of the mirror, for polarising the first and second pseudo-resistors each formed by an NMOS transistor between drain and source terminals, one drain terminal of the third PMOS transistor being connected to the gate terminals of pseudo-resistor NMOS transistors, and wherein the drain terminal of the third PMOS transistor is also connected to the drain and gate terminals of an NMOS polarising transistor, whose source terminal is connected, in an active branch, to the drain terminals of the first NMOS transistor and of the second PMOS transistor for the passage of the mirrored current into the third PMOS transistor, said polarising transistor and the pseudo-resistor transistors being matched with equal gate-source voltages.

* * * * *